US010346562B2

(12) United States Patent
Kapalko (10) Patent No.: US 10,346,562 B2
(45) Date of Patent: Jul. 9, 2019

(54) AUTOMATED CURVATURE MODELING OF POLYGONAL LINES

(71) Applicant: Dassault Systèmes Canada Inc., Montreal (CA)

(72) Inventor: Richard Kapalko, Brisbane (AU)

(73) Assignee: Dassault Systèmes Canada Inc., Montreal (CA)

( * ) Notice: Subject to any disclaimer, the term of this patent is extended or adjusted under 35 U.S.C. 154(b) by 889 days.

(21) Appl. No.: 14/465,230

(22) Filed: Aug. 21, 2014

(65) Prior Publication Data

US 2016/0055274 A1 Feb. 25, 2016

(51) Int. Cl.
*G05D 3/00* (2006.01)
*G06F 17/50* (2006.01)
*G06F 17/16* (2006.01)
*G01C 21/32* (2006.01)

(52) U.S. Cl.
CPC ......... *G06F 17/5009* (2013.01); *G01C 21/32* (2013.01); *G06F 17/16* (2013.01); *G06F 17/5004* (2013.01)

(58) Field of Classification Search
None
See application file for complete search history.

(56) References Cited

U.S. PATENT DOCUMENTS 5,978,731 A 11/1999 Matsuda
2009/0300067 A1* 12/2009 Denaro ............... B60W 40/072
2013/0179060 A1* 7/2013 Marczi .................. G08G 5/065
701/120
2013/0311153 A1* 11/2013 Moughler ............ G06Q 10/047
703/6
2014/0236483 A1* 8/2014 Beaurepaire ....... G01C 21/3626
701/533
2014/0278052 A1* 9/2014 Slavin ................ G01C 21/3492
701/400

(Continued)

OTHER PUBLICATIONS

Meir Barzohar et al. "Automatic Finding of Main Roads in Aerial Images by Using Geometric-Stochastic Models and Estimation" (Year: 1996).*

(Continued)

*Primary Examiner* — Brian W Wathen
*Assistant Examiner* — Abdou K Seye
(74) *Attorney, Agent, or Firm* — Hamilton, Brook, Smith & Reynolds, P.C.

(57) ABSTRACT

An embodiment may include, for a real world moving object moving along a real world path, modeling trajectory of the moving object along a polygon. The polygon may have a plurality of line segments and vertices and may represent the real world path for the moving object. A turn radius may be calculated at each vertex of the polygon. For a given vertex, the calculated turn radius may be associated with line segments of the polygon that originate from the given vertex. Using the calculated turn radii, a single-dimensional model may be formed of the real world path, where a respective calculated turn radius of the given vertex may serve as a measure of curvature of that portion of the real world path represented by the given vertex. The calculated turn radius of the respective given vertex may be defined by lane width of the real world path.

19 Claims, 7 Drawing Sheets

(56) References Cited

U.S. PATENT DOCUMENTS

2015/0115691 A1* 4/2015 Brinager .............. E21F 13/02
299/18

OTHER PUBLICATIONS

"GEOVIA Minex," GEOVIA Minex Version 6.4, Release Date Oct. 2014, Retrieved from the Internet URL: http://www.geovia.com/products/minex.
"GEOVIA Minex Modules Overview Datasheet," GEOVIA Minex Version 6.4, Release Date Oct. 2014, Retrieved from the Internet URL: http://www.geovia.com/products/minex.
Extended European Search Report for European Application No. 15 18 0319, "Automated Curvature Modeling Of Polygonal Lines," dated Jan. 27, 2016.
Choi, Ji-wung, and Elkaim, Gabriel Hugh, "Bézier Curve for Trajectory Guidance," Lecture Notes in Engineering and Computer Science, Oct. 1, 2008, pp. 625-630, XP055241139, Retrieved from the Internet: URL: https://users.soe.ucsc.edu/~elkaim/Documents/BezierWCES08.pdf.
Andersson, Simon, and Aronsson, Johannes, "Road Shape Modelling from Digital Map Data—and Implementation of a Map Supported Cruise Control," Jan. 1, 2009, XP055240294, Göteborg, Sweden, Retrieved from the Internet: URL: http://publications.lib.chalmers.se/records/fulltext/98883.pdf.

* cited by examiner

AUTOMATED CURVATURE MODELING OF POLYGONAL LINES

BACKGROUND OF THE INVENTION

In the arena of 3D modeling and simulation, the nature of the art is to capture key real-world characteristics with the smallest number of parameters to manage. When modeling curved lines, such as roads with polygonal line segments, the more points and additional parameters that are used, the smoother the curve is and more robust the model is. However, more points increases the complexity of the model and hence the cost to develop and maintain the model. And, even then, there is not an existing way to calculate the turn radius at each vertex or even an existing definition of turn radius as applied to a polygonal line.

There is a turn angle at each vertex of the line, but there is not a turn radius without additional information associated with the line. Additional points on the line may make a turn smoother, but there is still no notion of "turn radius" because all the segments are straight, and the vertices are thus "sharp" (instantaneous) angles. Without a "turn radius," there is no notion of road curvature, and thus, no notion of speed limits which is the desired characteristic to model with respect to road networks, especially in the craftwork of mine hauling simulation which relies heavily on speed limit.

SUMMARY OF THE INVENTION

A user may create a polygonal road model by providing input parameters into a model (and/or system and/or process). Alternatively, a process and/or system of the proposed approach may create a polygonal road model by capturing and/or determining input parameters. In a polygonal road model, what is needed is a new definition of "turn radius" which may be calculated at each vertex of a polygonal line. In the proposed approach, the "turn radius" captures the basic characteristics required (the notion of sharpness of turn) without much additional "overhead" to the polygonal road model. By contrast with the proposed approach, in existing approaches if the modeler (typically a user, but alternatively a system and/or process) intends to capture the key characteristic of road curvature, for example, with the intention of determining speed limits of the road, road curvature may not be captured without requiring extensive additional information.

In order to remedy the deficiencies of the existing approaches, the proposed approach defines "turn radius" at a vertex of a polygonal line with a single additional number. The additional number is a characteristic of the whole line, and therefore is the minimum possible additional overhead of the line model. The additional number may be called "lane width." Once the "turn radius" is calculated, the modeler (the user and/or system and/or process) has a measure of the curvature at each vertex of the line, even though the line is comprised of straight (non-curved) segments.

The proposed approach captures the curvature of a polygonal line while carrying a minimal amount of additional information (lane width). An advantage of the proposed approach is that it includes a definition of curvature at each vertex, independent of other neighboring vertexes, which helps by providing an independently measurable characteristic of each vertex.

The proposed approach is useful, at least because measuring the curvature of a road is preferably done for engineering projects that have a model that includes roads. Mining engineers are especially interested in road curvature as it applies directly to the speed limit and hence the total cycle time of the equipment fleet—a major factor in the cost of mine operations. The proposed approach may be used to determine speed limits at least for haulage planning and cycle time calculation of mine site models.

The efficiency of a model, such as a mine road network model, may be based on the amount of information maintained, the usefulness of those characteristics, and the ability to calculate the necessary characteristics in an automated way. In addition to applying to mine operations and mine planning and road network modeling, the proposed approach may be applied to fields of technology, including, but not limited to, modeling and simulation, civil engineering, and landscape architecture.

In existing approaches, additional information is required to determine road curvature because current modeling and simulation techniques require a set of additional parameters. For example, a road model may have additional characteristics attached to each vertex. In existing approaches, these additional characteristics are entered one at a time because there is not an existing method to calculate the notion of the "turn." By contrast with existing approaches, the proposed approach provides a method to calculate the notion of the "turn." A "turn" may be calculated by modeling a polygonal line and assigning a "turn" radius to each vertex, that is, using a non-automated (calculated) approach to the model technique.

Another alternative method is to abandon the polygonal approach and use a vector based approach which defeats the purpose of the using the more efficient polygonal approach. The proposed approach cleverly extends the capabilities of the simpler, cheaper, polygonal approach to modeling, by allowing the simple line model to be treated as if it has real-life curves.

In order to model real-life curves, the proposed approach enables the modeler to calculate road curvature with a single dimensional model of a road coupled with just one additional characteristic, the lane width. Interestingly, this is a novel and new approach. An entire discipline exists for civil engineering of roads, but existing approaches require an order of magnitude more qualities and quantities of characteristics or complicated curve-fitting mathematics, none of which is readily applicable to simple models. The simpler the model, while still capturing the real-world characteristics in question, the more resources may be applied to actually using the model to solve problems.

A key advantage of the proposed approach is a new geometrical definition of curvature for a polygonal vertex. Another advantage of the proposed approach is that it includes a geometrical approach and therefore solves the technical problems without being encumbered in domain specific nuances. The proposed approach is a novel approach to a general and complex issue in the broad arena of modeling and simulation. Another advantage of the proposed approach is that it exploits the natural relationship of the subtended angle, length of adjacent line segments, and given width as they apply to the real-world notion of "curvature."

The proposed approach includes a computer-implemented method, comprising, for a real world moving object moving along a path in the real world, modeling trajectory of the moving object along a polygon. The polygon may have a plurality of line segments and vertices. The polygon may represent the real world path for the moving object. The method may calculate a turn radius at each vertex of the polygon. For a given vertex, the calculated turn radius may be associated with line segments of the polygon that originate from the given vertex. Using the calculated turn radii, the method may form a model of the real world path where a respective calculated turn radius of the given vertex serves as a measure of curvature of that portion of the real world path represented by the given vertex. The formed model may be a single dimensional model and the calculated turn radius of the respective given vertex may be defined by lane width of the real world path.

The computer-implemented method may associate the measure of curvature with an angle located between the line segments of the polygon that originate from the given vertex. The computer-implemented method may also calculate the turn radius at each vertex of the polygon. For the given vertex, the turn radius may be calculated based upon a given angle located between the line segments of the polygon that originate from the given vertex, and based upon the lane width associated with the line segments of the polygon that originate from the given vertex. The trajectory of the moving object may be a curved trajectory. The turn radius may be a function of the lane width and the given angle.

The computer-implemented method may determine a turn of the moving object based upon length of a given line segment of the polygon. The length of the real world path may be associated with the turn being twice the length of the given line segment. The length of the given line segment may be a function of the turn radius and the given angle. The computer-implemented method may associate the turn radius with a length of a given line segment of the polygon, wherein the turn radius is a function of the given line segment and the given angle.

The computer-implemented method may determine a speed limit associated with the moving object, the speed limit being a function of the calculated turn radius. The computer-implemented method may form the model. Forming the model may include planning haulage and/or determining cycle time, based upon the calculated turn radius.

The proposed approach may include a computer-implemented system. The computer-implemented system may include a processing module configured to model trajectory of a moving object along a polygon, for a real world moving object moving along a path in the real world. The polygon may have a plurality of line segments and vertices and the polygon may represent the real world path for the moving object.

The processing module may be further configured to calculate a turn radius at each vertex of the polygon. The processing module may be further configured to associate, for a given vertex, the calculated turn radius with line segments of the polygon that originate from the given vertex. The processing module may be further configured to form a model of the real world path, using the calculated turn radii. A respective calculated turn radius of the given vertex may serve as a measure of curvature of that portion of the real world path represented by the given vertex. The formed model may be a single dimensional model and the calculated turn radius of the respective given vertex may be defined by lane width of the real world path.

The processing module may be further configured to associate the measure of curvature with an angle located between the line segments of the polygon that originate from the given vertex. The processing module may be further configured to calculate the turn radius, at each vertex of the polygon, for the given vertex, based upon a given angle located between the line segments of the polygon that originate from the given vertex, and based upon the lane width associated with the line segments of the polygon that originate from the given vertex. The trajectory may be a curved trajectory, and the turn radius may be a function of the lane width and the given angle.

The processing module may be further configured to determine a turn of the moving object based upon length of a given line segment of the polygon. The length of the real world path may be associated with the turn being twice the length of the given line segment. The length of the given line segment may be a function of the turn radius and the given angle.

The processing module may be further configured to associate the turn radius with a length of a given line segment of the polygon, wherein the turn radius is a function of the given line segment and the given angle. The processing module may be further configured to determine a speed limit associated with the moving object. The speed limit may be a function of the calculated turn radius. The processing module may be further configured to form the model to include at least one of planning haulage and determining cycle time, based upon the calculated turn radius.

The proposed approach may include a non-transitory computer readable medium having stored thereon a sequence of instructions which, when loaded and executed by a processor coupled to an apparatus causes the apparatus to model trajectory, calculate a turn radius, and form a model. The apparatus may model trajectory of a moving object along a polygon, for a real world moving object moving along a path in the real world. The polygon may have a plurality of line segments and vertices. The polygon may represent the real world path for the moving object. The apparatus may calculate a turn radius at each vertex of the polygon, and associate, for a given vertex, the calculated turn radius with line segments of the polygon that originate from the given vertex. The apparatus may form a model of the real world path, using the calculated turn radii. Each respective calculated turn radius of the given vertex may serve as a measure of curvature of that portion of the real world path represented by the given vertex. The formed model may be a single dimensional model and the calculated turn radius of the respective given vertex may be defined by lane width of the real world path.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

FIGS. 1-4 illustrate a simple calculation of turn radius, which is completed for each vertex of a polygonal line to capture the real-world notion of road curvature. The calculation is performed in an automated way by a system, process, and/or model 100 and without requiring additional information other than the lane width.

Figure 1:
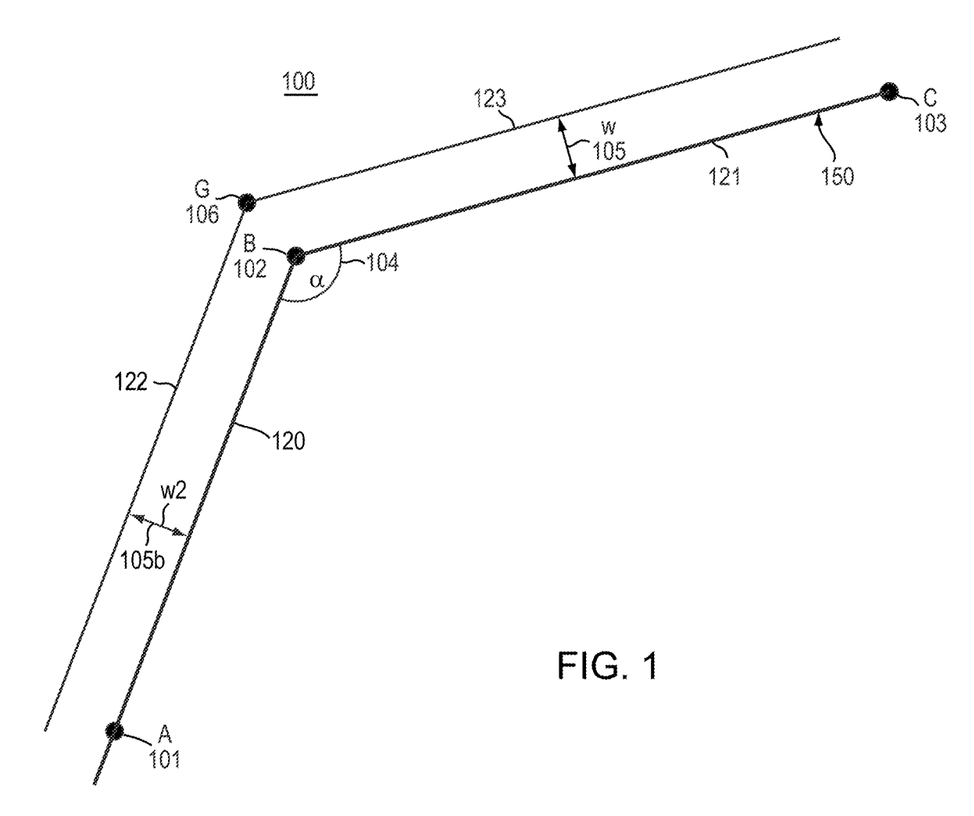
FIG. 1 is a schematic view of an embodiment illustrating a polygonal line with an associated turn.

FIG. 1 is a diagram showing a turn along a path ABC (element 150), ABC (element 150) being the path from vertex A (element 101) to vertex B (element 102) to vertex C (element 103). As illustrated in FIG. 1, a system, process, and/or model 100 embodying the present invention may include a polygon, which may include two or more inner line segments 120, 121 that connect together at vertex B (element 102). The line segment 120 includes vertex A (element 101) and vertex B (element 102), and line segment 121 includes vertex B (element 102) and vertex C (element 103). In one embodiment, by nature of having a lane width, the system, process, and/or model 100 implies two or more outer line segments 122, 123 that connect together at an outer vertex G (element 106). In an embodiment, each of the inner line segments (120, 121) is parallel to its corresponding outer line segment (122, 123, respectively), e.g., in an embodiment, line segment 120 is parallel to line segment 122, and line segment 121 is parallel to line segment 123. In another embodiment, each of the inner line segments (120, 121) may be parallel to its corresponding outer line segment (122, 123, respectively), e.g., in another embodiment, line segment 120 may be parallel to line segment 122, and line segment 121 may be parallel to line segment 123.

The system, process, and/or model 100 may also include a width w (element 105) between an inner line segment 121 and a corresponding outer line segment 123. The system, process, and/or model 100 may also include a width w2 (element 105b) between the inner line segment 120 and the respective corresponding outer line segment 122. Preferably, the width w2 (element 105b) is equal to the width w (element 105), but the width w2 (element 105b) is not so limited and may be greater than or less than width w (element 105). The polygon may also include an angle α (element 104) between inner line segments 120, 121.

Figure 2:
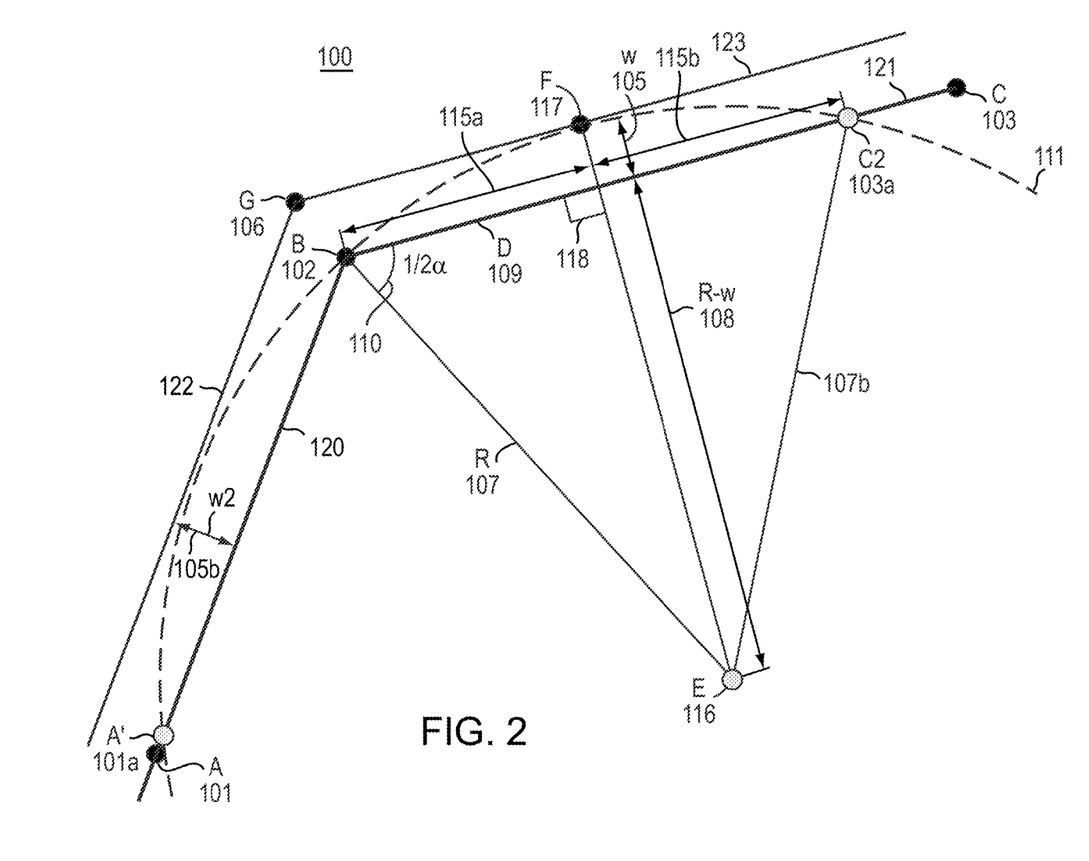
FIG. 2 is a schematic view of an embodiment, illustrating a turn radius along the path of FIG. 1.

FIG. 2 is a more detailed illustration of FIG. 1, showing the "turn radius" R (element 107) for a given trajectory, turn, and/or path 111 from vertex A' (element 101a) to vertex C2 (element 103a) represented in the system, process, and/or model 100. FIG. 2 illustrates the turn radius three times, each illustrated turn radius being of equal length to each other illustrated turn radius: a turn radius 107 from vertex E (element 116) to vertex B (element 102); a turn radius 107b from vertex E (element 116) to vertex C2 (element 103a); and a turn radius from vertex E (element 116) to vertex F (element 117).

As shown in FIG. 2, in one embodiment, the turn radius R (element 107) may be determined by the angle ½α (element 110) and the given width w (element 105) of the lane. The lane may be defined by a plurality of line segments, including but not limited to line segments 120, 121, 122, 123, and/or the area between the inner line segments 120, 121 and the outer line segments 122, 123. In other words, an angle of ½α (element 110) may be used in combination with the width w (element 105) in order to determine the turn radius R (element 107). As illustrated in FIG. 2, the line segment 108 is perpendicular (at a 90-degree angle, see element 118) to line segment 121, and the length of line segment 108 may be calculated as length R−w, e.g., the length of radius R (element 107) minus the length of width w (element 105). The line segment 121 may include two equal-sized segments 115a, 115b, each of length D (element 109).

The turn radius R (element 107) may be calculated by the following equation:

$$R = w/(1 - \sin(\tfrac{1}{2}\alpha))$$

Notionally, the path, turn, and/or trajectory 111 for the moving object in FIG. 2 may be described as "using every bit of the lane." As illustrated in FIG. 2, the adjacent segments leading into the turn 111 and out of the turn 111 are preferably of sufficient length to allow the whole turn 111.

Figure 3:
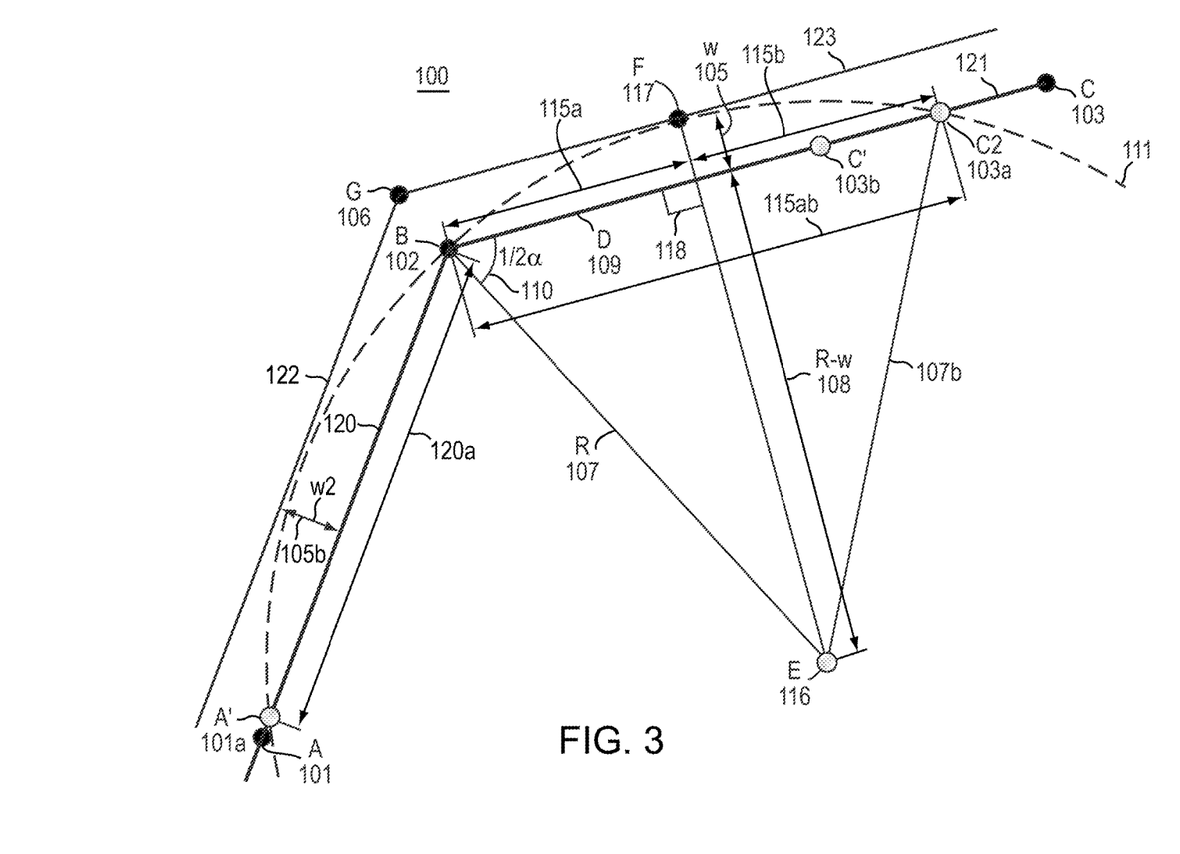
FIG. 3 is a schematic view of another embodiment, illustrating a turn radius along the path of FIG. 1.

FIG. 3 is a diagram of a situation where a vertex C' (element 103b) is positioned too near to its corresponding vertex B (element 102) for the conclusion of the current turn 111. In consideration of the lengths of the adjacent segments 115a, 115b, the proposed approach enables a second calculation. The length of road to achieve the turn 111 of FIG. 3 is equal to twice the length of D (element 109), as shown by the following equation:

$$2 \times D \text{ where } D = R \times \cos(\tfrac{1}{2}\alpha)$$

and if:

$$2 \times D > A'B \text{ or } 2 \times D > BC2,$$

then the turn 111 preferably should "get back to the middle of the lane by the end of the segment."

Note, in the equations above, A'B is the line segment 120a originating from vertex A' (element 101a) and ending at vertex B (element 102), and BC2 is the line segment 115ab originating from vertex B (element 102) and ending at vertex C2 (element 103). As illustrated in FIG. 3, the turn 111 required to intercept C' (element 103b) preferably does not use the whole width 105 and is restricted by the lengths of the line segments 115a, 115b.

Figure 4:
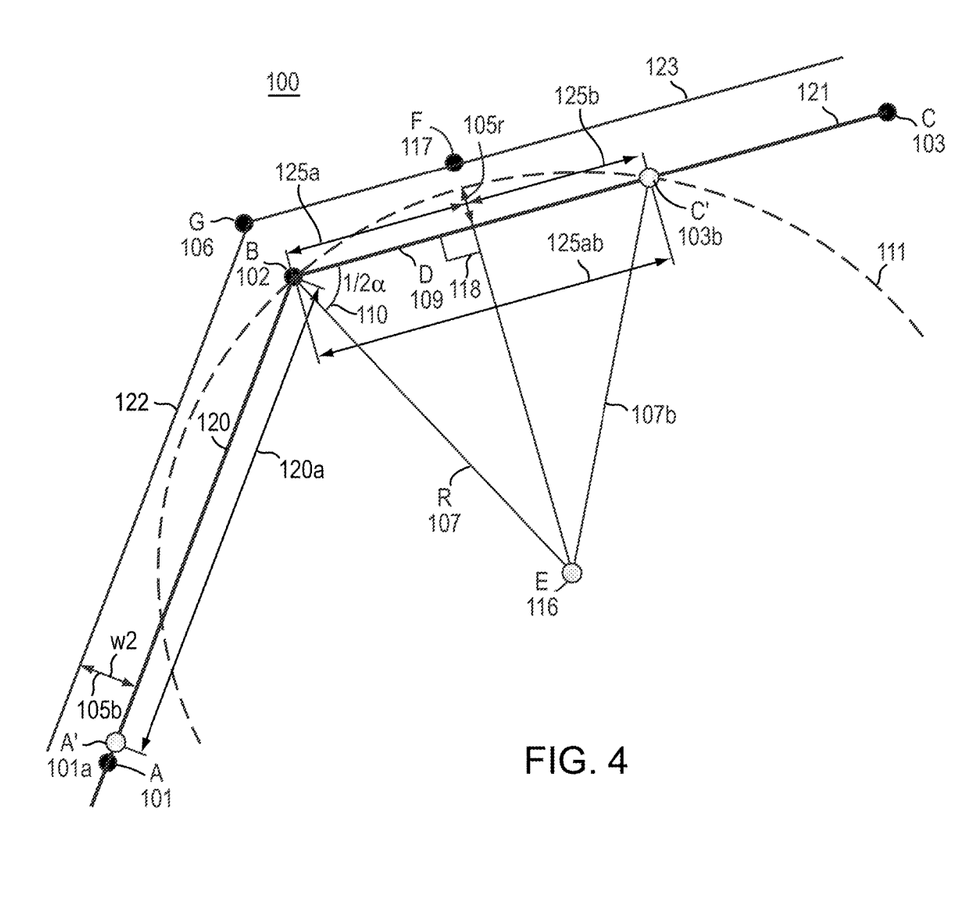
FIG. 4 is a schematic view of an embodiment, illustrating a reduced turn radius, for handling a sharper turn for the path of FIG. 1.

FIG. 4 illustrates a shorter line segment 125ab (which includes line segments 125a and 125b) as compared with the corresponding line segment 115ab (which includes line segments 115a and 115b) in FIG. 3. FIG. 4 is a diagram of the turn radius given by $$R = \text{length}(BC')/(2 \times \cos(\tfrac{1}{2}\alpha))$$

where R is element 107 and BC' (element 125ab) is the distance between vertices B (element 102) and C' (element 103b), e.g., the shorter of the two adjacent segments 120a, 125ab. By contrast with FIG. 3, FIG. 4 illustrates that the turn 111 may intercept C' (element 103b) by using a reduced lane width 105r, that is reduced as compared with the lane width 105 in FIG. 3.

Figure 5:
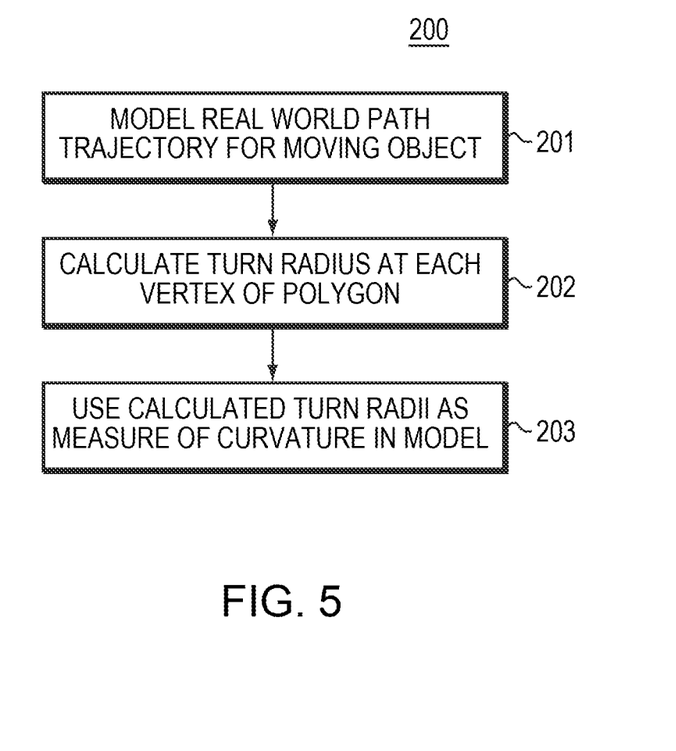
FIG. 5 illustrates a high-level flowchart of steps of a method embodying the present invention.

FIG. 5 illustrates a high-level flowchart 200 of steps of a system, process, and/or model 100 embodying the present invention. In step 201, the system, process, and/or model 100 models the trajectory for the moving object along a polygon. The polygon may have a plurality of line segments and vertices and represents the real world path for the moving object. The user may provide input parameters and/or input values to the system, process, and/or model 100 in order to model the trajectory. Alternatively, the input parameters and/or input values may be automatically defined and/or captured by the system, process, and/or model 100.

In step 202, the system, process, and/or model 100 calculates a turn radius at each vertex of the polygon. For a given vertex, the calculated turn radius is associated with line segments of the polygon that originate from the given vertex. In step 203, using the calculated turn radii, the system, process, and/or model 100 forms (and/or improves) a model along the real world path. A respective calculated turn radius of the given vertex serves as a measure of curvature of that portion of the real world path represented by the given vertex. The formed model is a single dimensional model (representing lane width) and the calculated turn radius of the respective given vertex is defined by lane width of the real world path. The system, process, and/or model 100 may optionally report the turn radius and/or other parameters to a user through a computer interface (see FIG. 6 element 50 to follow).

Figure 6:
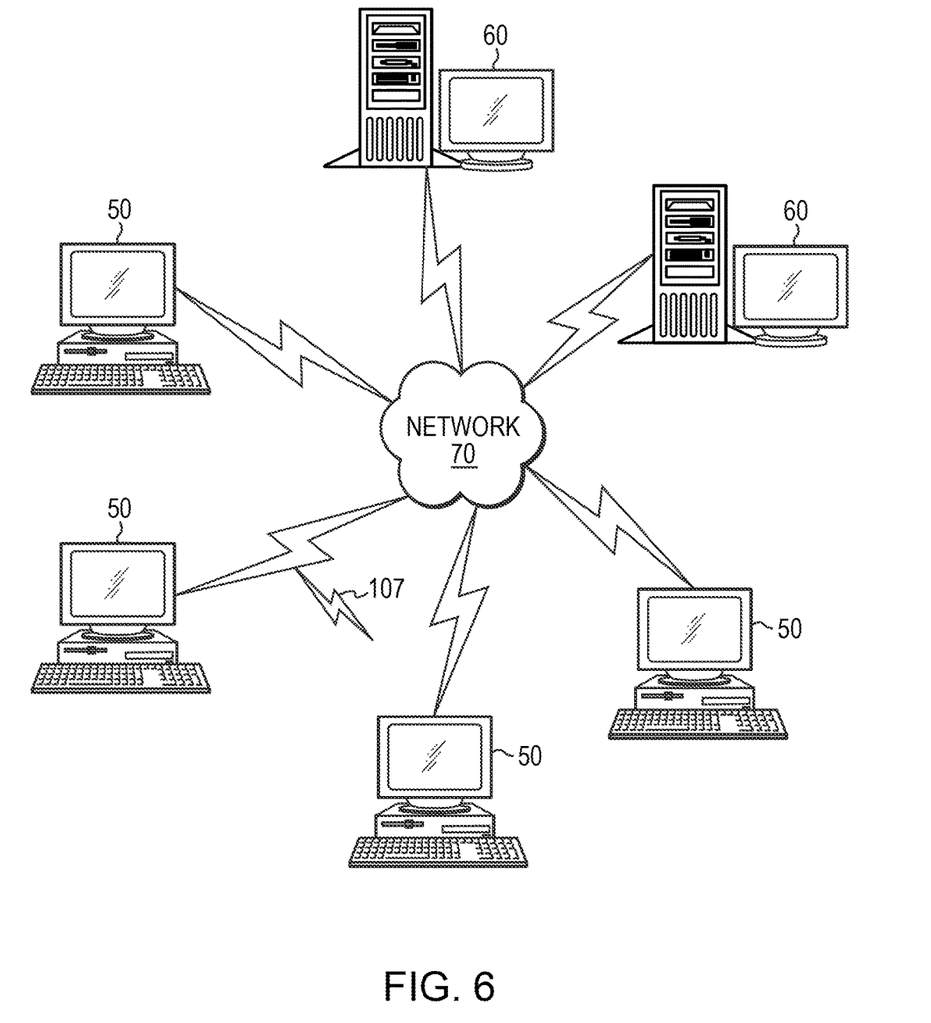
FIG. 6 illustrates a computer network or similar digital processing environment in which embodiments of the present invention may be implemented.

FIG. 6 illustrates a computer network or similar digital processing environment in which the proposed approach may be implemented. Client computer(s)/devices 50 and server computer(s) 60 provide processing, storage, and input/output devices executing application programs and the like. Client computer(s)/devices 50 may also be linked through communications network 70 to other computing devices, including other client devices/processes 50 and server computer(s) 60. Communications network 70 may be part of a remote access network, a global or local network (e.g., the Internet), a worldwide collection of computers, Local area or Wide area networks, and gateways that currently use respective protocols (TCP/IP, BLUETOOTH™, etc.) to communicate with one another. Other electronic device/computer network architectures are suitable.

Figure 7:
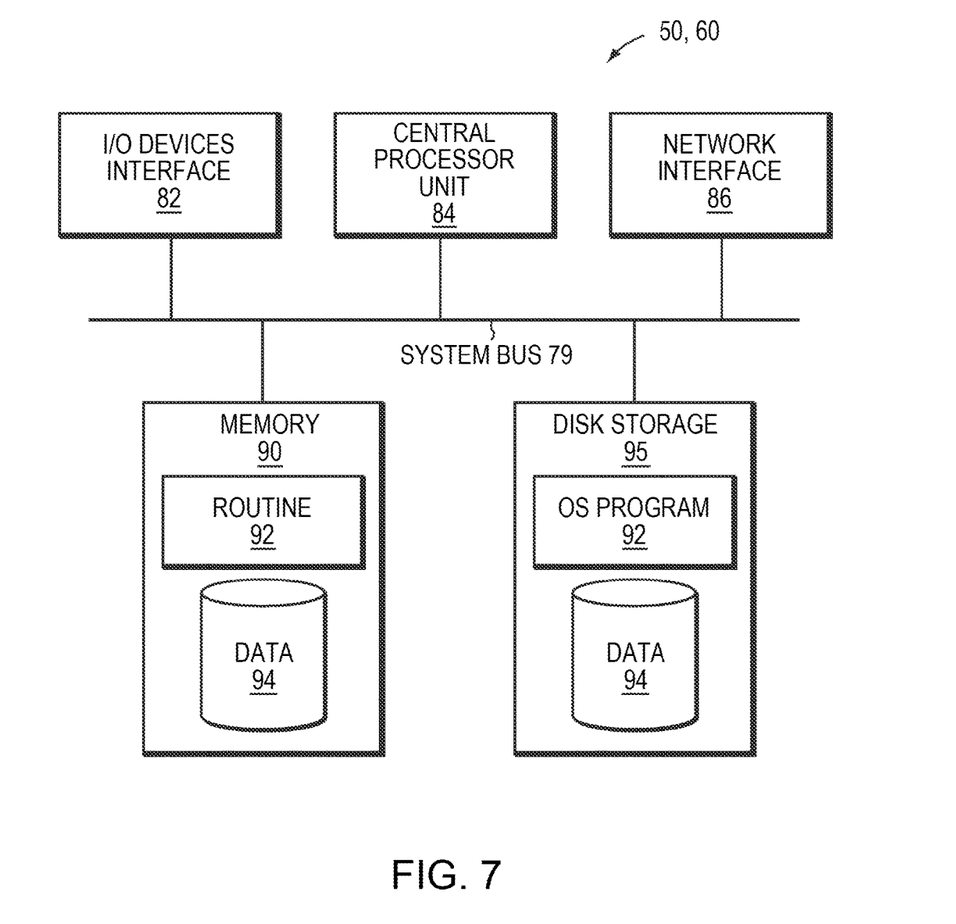
FIG. 7 is a diagram of the internal structure of a computer in the computer system of FIG. 6.

FIG. 7 is a diagram of the internal structure of a computer (e.g., client processor/device 50 or server computers 60) in the computer system of FIG. 6. Each computer 50, 60 contains system bus 79, where a bus is a set of hardware lines used for data transfer among the components of a computer or processing system. Bus 79 is essentially a shared conduit that connects different elements of a computer system (e.g., processor, disk storage, memory, input/output ports, network ports, etc.) that enables the transfer of information between the elements. Attached to system bus 79 is I/O device interface 82 for connecting various input and output devices (e.g., keyboard, mouse, displays, printers, speakers, etc.) to the computer 50, 60. Network interface 86 allows the computer to connect to various other devices attached to a network (e.g., network 70 of FIG. 6). Memory 90 provides volatile storage for computer software instructions 92 and data 94 used to implement an embodiment of the proposed approach (e.g., system, process, or model 100 and operative steps 200 thereof detailed above). Disk storage 95 provides non-volatile storage for computer software instructions 92 and data 94 used to implement an embodiment of the proposed approach. Note, data 94 may be the same between a client 50 and server 60, however, the type of computer software instructions 92 may differ between a client 50 and a server 60. Central processor unit 84 is also attached to system bus 79 and provides for the execution of computer instructions.

In one embodiment, the processor routines 92 and data 94 are a computer program product (generally referenced 92), including a computer readable medium (e.g., a removable storage medium such as one or more DVD-ROM's, CD-ROM's, diskettes, tapes, etc.) that provides at least a portion of the software instructions for the invention system. Computer program product 92 may be installed by any suitable software installation procedure, as is well known in the art. In another embodiment, at least a portion of the software instructions may also be downloaded over a cable, communication and/or wireless connection. In other embodiments, the invention programs are a computer program propagated signal product 107 (shown in FIG. 6) embodied on a propagated signal on a propagation medium (e.g., a radio wave, an infrared wave, a laser wave, a sound wave, or an electrical wave propagated over a global network such as the Internet, or other network(s)). Such carrier medium or signals provide at least a portion of the software instructions for the proposed approach routines/program 92.

In alternate embodiments, the propagated signal is an analog carrier wave or digital signal carried on the propagated medium. For example, the propagated signal may be a digitized signal propagated over a global network (e.g., the Internet), a telecommunications network, or other network. In one embodiment, the propagated signal is a signal that is transmitted over the propagation medium over a period of time, such as the instructions for a software application sent in packets over a network over a period of milliseconds, seconds, minutes, or longer. In another embodiment, the computer readable medium of computer program product 92 is a propagation medium that the computer system 50 may receive and read, such as by receiving the propagation medium and identifying a propagated signal embodied in the propagation medium, as described above for computer program propagated signal product.

Generally speaking, the term "carrier medium" or transient carrier encompasses the foregoing transient signals, propagated signals, propagated medium, storage medium and the like.

Advantages of the proposed approach include, but are not limited to, the following. One advantage of the proposed approach is that it provides a definition of turn radius for a polygonal line segment. Another advantage of the proposed approach is that it provides a novel definition for the modeling characteristic that is curvature of a vertex of a polygonal line.

Another advantage of the proposed approach is that it is immediately applicable to any model that may be enhanced by the notion of curvature of a polygonal (straight) line. Although there are wealth of concepts in mathematics and civil engineering associated with curve fitting and roadway turns, they fail to simplify to the extent that is so globally applicable to modeling and simulation. Yet another advantage of the proposed approach is that it is uniquely elegant in its simplicity.

Another advantage of the proposed approach is that, the user (modeler) experience is enhanced by not having to develop and manage a collection of additional parameters that may not add to the intended model. Entering a single number (lane width) is painless—less overhead in the creation and maintenance of the model than in existing approaches.

In addition, the proposed approach has been successfully tested for proof of concept. The software package GEOVIA MINEX may assign a maximum speed limit for the length of modeled road based on the minimum turn radii for each of the polygonal line's vertices. The proposed approach is successfully applied to the automated speed limit functionality of the Haulage Planning module of GEOVIA MINEX Dump Scheduling and Planning. In one embodiment, the turn radius of the whole line is defined as the minimum of the turn radii for each vertex (excluding end points of course which have no angular vertex).

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method of modeling a road network, comprising:

for a real world moving object moving along a path in the real world, the real world path being part of a road network, modeling, in a computer, trajectory of the moving object along a polygon, the polygon having a plurality of line segments and vertices, the polygon representing the real world path for the moving object;

automatically calculating, by the computer, a turn radius at each vertex of the polygon, for a given vertex, the calculated turn radius being associated with line segments of the polygon that originate from the given vertex;

automatically, by the computer, using the calculated turn radii and forming a model of the real world path where a respective calculated turn radius of the given vertex of the polygon serves as a measure of curvature of that portion of the real world path represented by the given vertex, the measure of curvature at the given vertex being independent of a corresponding measure of curvature at each other vertex of the polygon, the formed model of the real world path being a single dimensional model of a lane width of the real world path and the calculated turn radius of the respective given vertex being solely defined by the lane width of the real world path;

including the formed model of the real world path in a model of the road network, said including being automated by the computer and resulting in an improved road network model; and simulating transportation of industrial resources using the improved road network model, the simulating including a processor determining industrial operations associated with the transported industrial resources.

2. The computer-implemented method of claim 1, further comprising:
associating the measure of curvature with an angle located between the line segments of the polygon that originate from the given vertex.

3. The computer-implemented method of claim 1, further comprising:
calculating the turn radius at each vertex of the polygon, for the given vertex, based upon a given angle located between the line segments of the polygon that originate from the given vertex, and based upon the lane width associated with the line segments of the polygon that originate from the given vertex.

4. The computer-implemented method of claim 1, wherein the trajectory is a curved trajectory.

5. The computer-implemented method of claim 3, wherein the turn radius is a function of the lane width and the given angle.

6. The computer-implemented method of claim 3, further comprising:
determining a turn of the moving object based upon length of a given line segment of the polygon, the length of the real world path associated with the turn being twice the length of the given line segment, wherein the length of the given line segment is a function of the turn radius and the given angle.

7. The computer-implemented method of claim 3, further comprising:
associating the turn radius with a length of a given line segment of the polygon, wherein the turn radius is a function of the given line segment and the given angle.

8. The computer-implemented method of claim 1, further comprising:
determining a speed limit associated with the moving object, the speed limit being a function of the calculated turn radius.

9. The computer-implemented method of claim 1, wherein forming the model includes:
at least one of planning haulage and determining cycle time, based upon the calculated turn radius.

10. A computer-implemented system for modeling a road network, comprising:

a processor; and a memory with computer code instructions stored thereon, the memory operatively coupled to the processor such that, when executed by the processor, the computer code instructions cause the computer system to implement:

a processing module configured to model trajectory of a moving object along a polygon, for a real world moving object moving along a path in the real world, the real world path being part of a road network, the polygon having a plurality of line segments and vertices, the polygon representing the real world path for the moving object;

the processing module further configured to calculate a turn radius at each vertex of the polygon, and the processing module further configured to associate, for a given vertex, the calculated turn radius with line segments of the polygon that originate from the given vertex;

the processing module further configured to form a model of the real world path, using the calculated turn radii, where a respective calculated turn radius of the given vertex of the polygon serves as a measure of curvature of that portion of the real world path represented by the given vertex, the formed model of the real world path being a single dimensional model of a lane width of the real world path and the calculated turn radius of the respective given vertex being solely defined by the lane width of the real world path, wherein the processing module includes the formed model of the real world path in a model of the road network resulting in an improved road network model; and the processing module further configured to simulate transportation of industrial resources using the improved road network model, the simulating including determining industrial operations associated with the transported industrial resources.

11. The computer-implemented system of claim 10, wherein the processing module is further configured to associate the measure of curvature with an angle located between the line segments of the polygon that originate from the given vertex.

12. The computer-implemented system of claim 10, wherein the processing module is further configured to calculate the turn radius, at each vertex of the polygon, for the given vertex, based upon a given angle located between the line segments of the polygon that originate from the given vertex, and based upon the lane width associated with the line segments of the polygon that originate from the given vertex.

13. The computer-implemented system of claim 10, wherein the trajectory is a curved trajectory.

14. The computer-implemented system of claim 12, wherein the turn radius is a function of the lane width and the given angle.

15. The computer-implemented system of claim 12, wherein the processing module is further configured to determine a turn of the moving object based upon length of a given line segment of the polygon, the length of the real world path associated with the turn being twice the length of the given line segment, wherein the length of the given line segment is a function of the turn radius and the given angle.

16. The computer-implemented system of claim 12, wherein the processing module is further configured to associate the turn radius with a length of a given line segment of the polygon, wherein the turn radius is a function of the given line segment and the given angle.

17. The computer-implemented system of claim 10, wherein the processing module is further configured to determine a speed limit associated with the moving object, the speed limit being a function of the calculated turn radius.

18. The computer-implemented system of claim 10, wherein the processing module is further configured to form the model to include at least one of planning haulage and determining cycle time, based upon the calculated turn radius.

19. A non-transitory computer readable medium having stored thereon a sequence of instructions for modeling a road network which, when loaded and executed by a processor coupled to an apparatus causes the apparatus to:
 model trajectory of a moving object along a polygon, for a real world moving object moving along a path in the real world, the real world path being part of a road network, the polygon having a plurality of line segments and vertices, the polygon representing the real world path for the moving object;
 calculate a turn radius at each vertex of the polygon, and associate, for a given vertex, the calculated turn radius with line segments of the polygon that originate from the given vertex;
 form a model of the real world path, using the calculated turn radii, where each respective calculated turn radius of the given vertex of the polygon serves as a measure of curvature of that portion of the real world path represented by the given vertex, the formed model of the real world path being a single dimensional model of a lane width of the real world path and the calculated turn radius of the respective given vertex being solely defined by the lane width of the real world path;
 include the formed model of the real world path in a model of the road network resulting in an improved road network model; and
 simulate transportation of industrial resources using the improved road network model, the simulating including determining industrial operations associated with the transported industrial resources.

* * * * *